United States Patent [19]
White

[11] Patent Number: 5,793,196
[45] Date of Patent: Aug. 11, 1998

[54] CURRENT TRANSFORMER FOR MEASURING DIFFERENTIAL-MODE AND COMMON-MODE CURRENT

[75] Inventor: Curtis B. White, Rockford, Ill.

[73] Assignee: Sundstrand Corporation, Rockford, Ill.

[21] Appl. No.: 676,866

[22] Filed: Jul. 3, 1996

[51] Int. Cl.$^6$ .................................................. G01R 1/20
[52] U.S. Cl. ................................. 324/127; 324/117 R
[58] Field of Search ........................... 324/127, 126, 324/140, 142, 73.1, 725, 117 R

[56] References Cited

U.S. PATENT DOCUMENTS

| | | | |
|---|---|---|---|
| 2,146,555 | 2/1939 | Arey | 324/127 |
| 2,729,788 | 1/1956 | Schweitzer, Jr. | 324/127 |
| 2,831,164 | 4/1958 | Johnson | 324/127 |
| 2,883,622 | 4/1959 | Lenehan | 324/137 |
| 3,332,863 | 7/1967 | Woods | 324/127 |
| 3,431,487 | 3/1969 | Savage | 323/50 |
| 3,582,774 | 6/1971 | Forgacs | 324/127 |
| 4,263,549 | 4/1981 | Toppeto | 324/127 |
| 4,912,396 | 3/1990 | Groenenboom | 324/117 R |
| 5,590,031 | 12/1996 | Mead, Jr. et al. | 324/117 R |

*Primary Examiner*—Ernest F. Karlsen
*Attorney, Agent, or Firm*—Antonelli, Terry, Stout & Kraus

[57] ABSTRACT

A measuring device for measuring time varying differential-mode currents flowing in first and second conductive groups includes a low reluctance magnetic circuit including first and second portions defining first and second openings positionable to surround the first and second conductive groups. The magnetic circuit comprises a twisted loop which cancels common-mode flux produced by common-mode current flowing in the first and second conductive groups.

20 Claims, 5 Drawing Sheets

CURRENT TRANSFORMER FOR MEASURING DIFFERENTIAL-MODE AND COMMON-MODE CURRENT

TECHNICAL FIELD

The present invention relates to devices for measuring time varying differential-mode and common-mode currents and, more particularly, to devices of the aforementioned type which permit measurement of common and differential-mode circuits without modification or disconnection of an electrical circuit containing the currents being measured.

BACKGROUND ART

Current transformers are currently used to measure either common-mode current or differential-mode current which is flowing in an electrical circuit conducting substantial electrical power. In a typical application using power electronics, such as an inverter for generating alternating current, complex currents flow which have both differential and common-mode components which make up the totality of the flowing current. Because differential-mode and common-mode currents share the same conductive paths, their independent measurement to date has been difficult to achieve with current transformers. The measurement of differential-mode currents generally requires significant modification or cutting of wiring in which differential-mode current is being measured.

It is well known that common-mode currents are considered to be a major contributor to electrical interference in applications involving power electronics. Such interference is a major problem in the advancement of power electronics. New national and international regulations have recently been established to regulate problems involving excessive differential-mode and common-mode currents which may range from low frequency up to high frequencies such as 50 MHz or higher. Furthermore, electrical analysis of power circuit application malfunctions and diagnosis of malfunctions therein often requires the identifying of and differentiation between common-mode and differential current mode components in the totality of current flowing in the electrical power circuit application.

Figure 1:
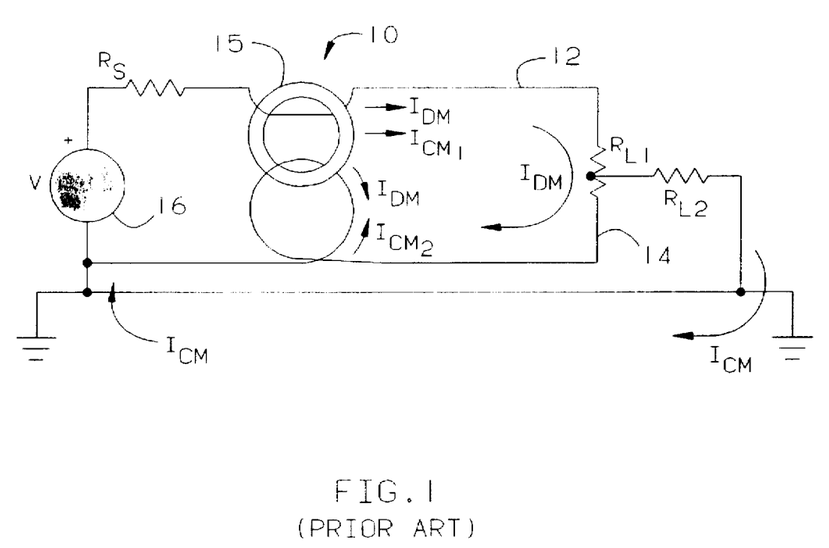
FIG. 1 illustrates a diagram of a prior art current transformer used for measuring differential-mode current.

FIG. 1 illustrates a prior art use of a typical current transformer 10 for measuring differential-mode current. Common-mode currents are cancelled by reversing the direction of current flow in one of two conductors 12 and 14 which pass through the core 15 of the current transformer 10. As illustrated, the first conductor 12 passes directly through the core 15 and the second conductor 14 is looped around the core to reverse the direction of current flow through the core to create a magnetic flux which opposes the magnetic flux produced by current flow through the first conductor. A voltage source 16 applies a voltage V which produces current flow through a first resistor $R_S$ which is equal to the sum of $I_{DM}$ which is the differential-mode current flow and $I_{CM1}$ which is the common-mode current flowing in conductor 12. A first load resistor $R_{L1}$ has a tap applying current to the second load resistor $R_{L2}$ through which the total common-mode current $I_{CM}$ flows to ground. Because of the looping of the second conductor 14 through the core 15 of the current transformer 10 to reverse the direction of current flow, the common-mode current $I_{CM1}$ flowing in the first conductor 12 is equal to but opposite in direction to the common-mode current $I_{CM2}$ which flows in the second conductor 14. The resultant magnetic fluxes produced by the common-mode components $I_{CM1}$ and $I_{CM2}$ are equal and opposite in the core 15 which results in the current transformer 10 sensing only twice the total of the differential-mode current $I_{DM}$. It should be noted that the secondary windings of the current transformer, which output a current flow proportional to twice the differential-mode current, have not been illustrated.

Figure 2:
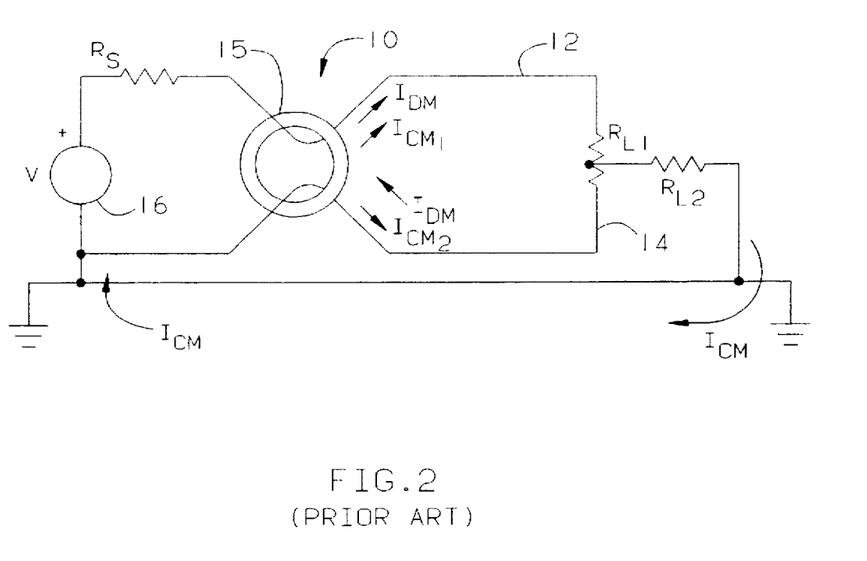
FIG. 2 illustrates a diagram of a prior art current transformer used for measuring common-mode current.

FIG. 2 illustrates a prior art usage of a current transformer 10 to measure common-mode current. As illustrated, the differential-mode current $I_{DM}$ flowing in the first conductor 12 is equal and opposite to the differential-mode current $I_{DM}$ flowing in the second conductor 14 which produces equal and opposite fluxes in the core 15 causing cancellation of the differential-mode current. As a result, the current transformer 10 senses twice the common-mode current $I_{CM}$ and outputs a signal proportional to twice the common-mode current. Like FIG. 1, FIG. 2 does not illustrate the secondary winding of the current transformer 10.

Other systems have been proposed for measuring alternating current using current transformers. See U.S. Pat. Nos. 2,883,622, 3,332,863, 3,431,487 and 4,263,549. The systems described in the aforementioned patents do not provide a current measuring device for measuring differential and common-mode currents in conductive paths associated with power electronics without alteration, such as breaking connections, cutting wires or extending wires or harnesses which are costly and/or are time consuming.

DISCLOSURE OF THE INVENTION

The present invention provides an improved device for measuring at least time varying differential-mode current and common-mode and differential-mode current flowing in first and second conductive groups, such as single or multiple wires, without requiring alternation of the conductive groups. Either common-mode or differential-mode current flowing in each conductive group may be measured from a single pair of outputs without requiring modification of the configuration of the conductive groups such as described above in conjunction with FIG. 1. Alternatively, common and differential-mode currents may be measured simultaneously from two pairs of outputs. With the present invention, differential-mode currents from low frequency just above DC up to 50 MHz. or higher may be measured by simply positioning a housing, having first and second parts which are connected together by a pivot to permit pivoting of the housing between open and closed positions, to surround during measuring the conductive groups in which current flow is being measured. Each part of the housing has first and second channels which are fabricated, located or extend into a surface therein for receiving the first and second conductive groups when the housing is in the open position. The first and second channels of each part of the housing are opposed to each other and respectively surround the first and second conductive groups to form passages through the housing when the housing is in the closed position which contain the first and second conductive groups. Low reluctance magnetic circuits of first and second current transformers surround the passages through the housing and respectively produce outputs proportional to differential-mode and common-mode currents. This configuration permits the use of a measuring device in accordance with the invention without modifying the electrical conductive groups in which differential-mode or common-mode currents are being measured or common-mode and differential-mode currents are separately being measured which is a major disadvantage of the prior art as discussed above.

The low reluctance magnetic circuits have multiple parts which are split between the first and second parts of the housing. The low reluctance magnetic circuits surround the first and second passages and the first and second conductive groups contained therein extending through the housing when the housing is in the closed position. The multiple part low reluctance magnetic circuits establish a continuous magnetic flux linkage between each of the first and second conductive groups which function as first and second primaries of the current transformers. The secondary of the current transformer, which measures differential-mode currents, has at least one turn wound around a first portion of the low reluctance magnetic circuit defining a first opening surrounding the first conductive group and at least one turn around a second portion of the low reluctance magnetic circuit defining a second opening surrounding the second conductive group and cancels common-mode flux from the secondary winding because the respective magnetic flux linkages in the low reluctance magnetic circuit produced by the common-mode currents in the first and second conductive groups are in phase opposition. The shape and size of the openings may be varied in the practice of the invention, as long as any crossover of the low reluctance magnetic circuit, such as a FIG. 8 when viewed from above, does not touch to create a short circuit low reluctance magnetic path. The terminology first and second openings, as used herein, describes the opening of the low reluctance magnetic circuit to receive the first and second conductive groups without short circuiting of the low reluctance magnetic circuit and without modification of the first and second conductive groups. The openings may be formed by twisting a single loop one or more times so that the flow of magnetic flux caused by common-mode currents in the first and second openings which surround the first and second conductive groups are in phase opposition to each other and cutting the twisted loops into parts as described below or alternatively directly forming the parts which may be configured in the housing described below into the twisted loop. The secondary of the current transformer which measures the common-mode currents has at least one turn wound around the low reluctance magnetic circuit.

In a preferred application of the present invention, a switch, such as a single pole double throw or double-pole double throw switch, having a single output if a ground reference is used or a pair of outputs respectively which are selectively connected by switching to the outputs of the secondary of the first current transformer or the second current transformer to selectively output a current proportional to the differential-mode or common-mode current flowing in the first and second conductive groups. This configuration permits a single measuring device to be used selectively to measure differential-mode or common-mode currents flowing in first and second conductive groups which has not been accomplished in the prior art. The measurement of the differential-mode and common-mode currents does not require modification such cutting, twisting, extending, etc. of the first and second current groups as in the prior art as described above in conjunction with FIG. 1.

Alternatively, the secondaries of the first and second current transformers may have dedicated pairs of outputs. This configuration permits the simultaneous outputting of common-mode and differential-mode currents without modification of the first and second conductive groups.

BEST MODE FOR CARRYING OUT THE INVENTION

Figure 3:
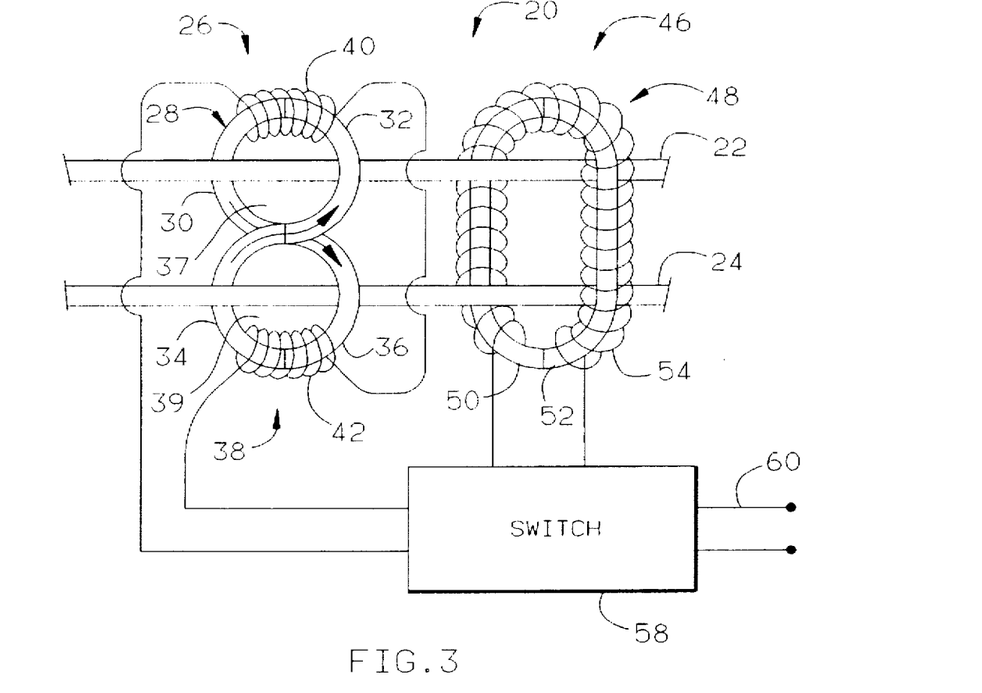
FIG. 3 illustrates a first embodiment of the present invention which permits the selective measurement of either differential-mode or common-mode currents flowing in first and second conductive groups.
Figure 4:
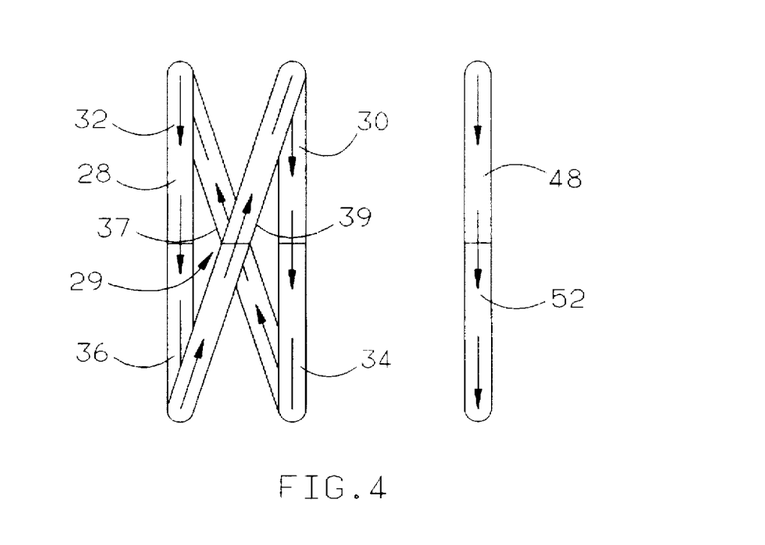
FIG. 4 illustrates a side edge view of the first and second low reluctance magnetic circuits of the embodiment of FIG. 3.
Figure 5:
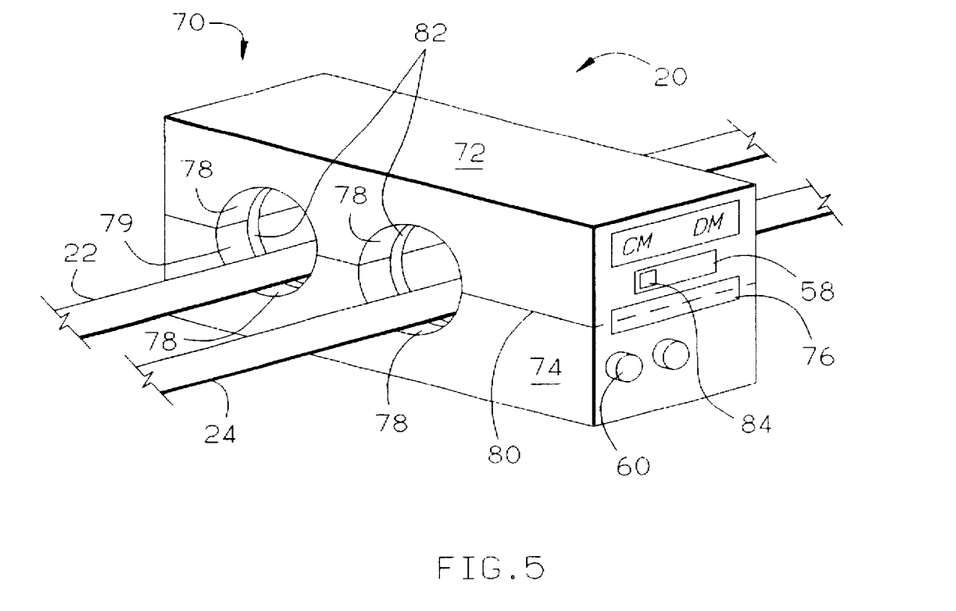
FIG. 5 illustrates the embodiment of FIG. 3 positioned in a housing.
Figure 6:
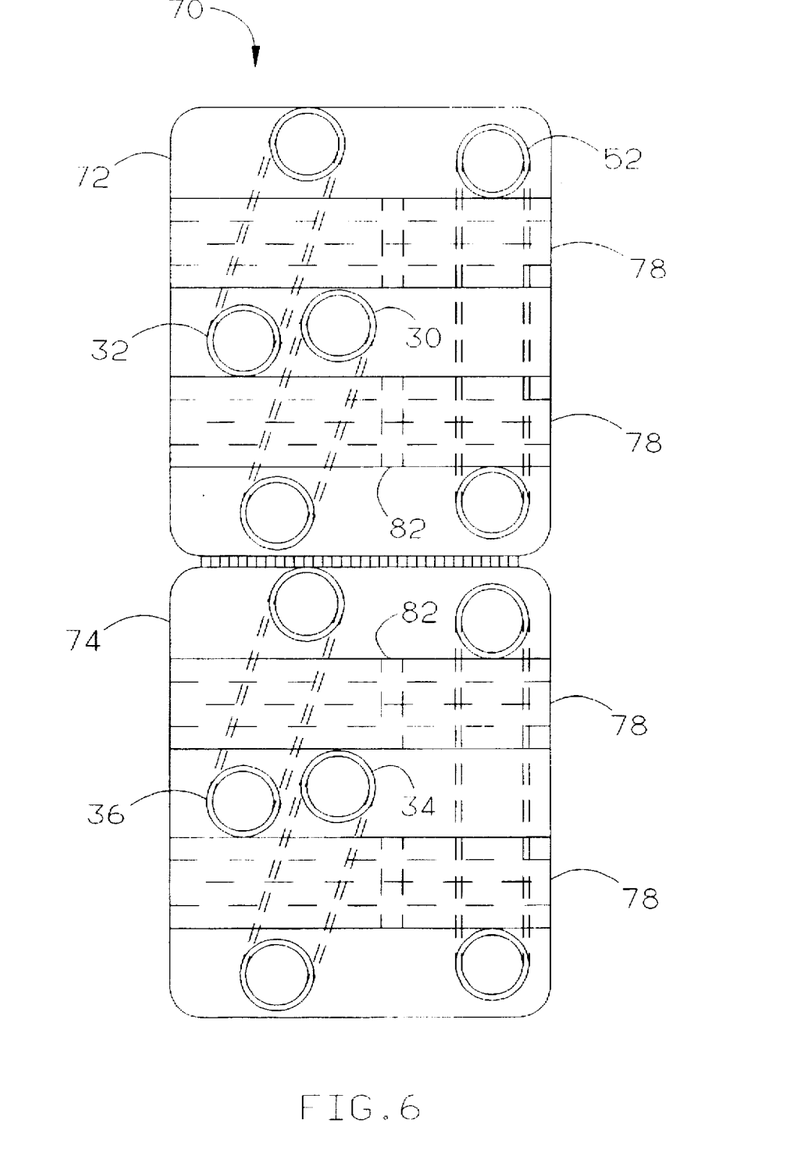
FIG. 6 illustrates a view of the first and second low reluctance magnetic circuits of the embodiment of FIG. 5 positioned in a fully open position with the parts of the housing rotated 180° relative to each other showing ends of low reluctance paths and channels for the conductive groups.

FIG. 3 illustrates a first embodiment of a device 20 for measuring time varying differential-mode and common-mode currents flowing in first and second conductive groups 22 and 24. The first and second conductive groups 22 and 24 may be a single wire or alternatively, may be a bundle of wires such as is commonly encountered with electronics applications. A first current transformer 26 has a low reluctance magnetic circuit 28 which is a continuous loop having a pair of openings 37 and 39 for receiving the conductive groups 22 and 24 in the open position as illustrated in FIG. 6 described below, which preferably is in the form of a FIG. 8, in which there is no contact at any crossover, such as crossover 29, which would create a low reluctance short circuit and, for example, contains four parts 30, 32, 34 and 36 which separate to permit the pivoting of a housing containing the four parts split between upper and lower parts as illustrated in FIG. 6 into a fully open position to receive the first and second conductive groups 22 and 24 and into a closed position as illustrated in FIG. 5 to surround and contain the conductive groups 22 and 24 for purposes of measuring current as described below. The function of the openings 37 and 39 is to configure the low reluctance magnetic circuit 28 to reverse the magnetic flux caused by common-mode currents flowing in the first and second conductive groups 22 and 24. The openings may have any desired size or shape. In the closed position, the cross sections of the parts 30, 32, 34 and 36 are aligned in a FIG. 8 which does not touch at crossover point 29 to form a continuous low reluctance magnetic circuit having two openings 37 and 39 for receiving and which respectively surround the first and second conductive groups 22 and 24. The four parts 30, 32, 34 and 36 are each in the form of a quarter of the loop which are aligned in cross section when the housing 70 is closed to form the low reluctance magnetic circuit having two openings 37 and 39 of the FIG. 8 which surround and contain the first and second conductive groups 22 and 24. A preferred cross section of the openings 37 and 39 of the low reluctance magnetic circuit 28 is circular, but the invention is not limited to any specific cross section. The low reluctance magnetic circuit 28 may be made from magnetically permeable materials such as, but not limited to, iron, iron powder or ferrites. The ferrites have a higher frequency response to permit measurement of higher frequency current components. The semicircular parts 30 and 32 form the first opening 37 and the semicircular second parts 34 and 36 form the second opening 39. The function of the first and second openings 37 and 39 in the low reluctance magnetic circuit 28 is to reverse the direction of flux in the low reluctance magnetic circuit induced therein caused by common-mode currents flowing in the first and second conductive groups 22 and 24 to produce cancellation thereof. Each of the parts 30, 32, 34 and 36 has a pitch or twist along a longitudinal axis of the FIG. 8 as best seen in FIG. 4 which prevents contact at crossover 29 therebetween where the parts overlap when the housing 70 is closed.

The first and second conductive groups 22 and 24 are first and second primaries of the current transformer 26. The low reluctance magnetic circuit 28 magnetically links the first and second primaries with secondary winding 38 having at least one turn 40 surrounding and wound upon the portion of the loop having the first opening 37 and/or at least one turn 42 surrounding and wound upon the portion of the loop having the second opening 39. As is described in more detail below, the low reluctance magnetic circuit 26 has preferably four parts equally divided between and held in upper and lower parts of a pivotable housing 70 with the parts in the upper part being movable relative to the parts in the lower part to open the first and second openings 37 and 39 to receive the first and second conductive groups 22 and 24 and to close the first and second openings to surround the first and second conductive groups in a configuration as illustrated in FIG. 4.

A second current transformer 46 having a low reluctance magnetic circuit 48 functions to sense the common-mode current flowing in the first and second conductive groups 22 and 24. The low reluctance magnetic circuit 48 may be made of the same materials used for making the low reluctance magnetic circuit 26 and is formed from first and second parts 50 and 52 which respectively are held in the upper and lower parts of the housing 70 and are aligned in cross section to complete the low reluctance magnetic circuit as described below when the housing 70 is closed. The first and second conductive groups 22 and 24 function as primaries of the second current transformer 46. A secondary winding 54 having at least one turn surrounds and is wound upon the low reluctance magnetic circuit 48 and produces an output current proportional to common-mode currents flowing in the first and second conductive groups 22 and 24. The low reluctance magnetic circuit 48 links the first and second primaries to the secondary winding 54. The low reluctance magnetic circuit 48 is positioned to receive the first and second conductive groups 22 and 24 as illustrated below in FIG. 6 and is positioned as illustrated in FIG. 4 to surround the first and second conductive groups to position the housing, as illustrated in FIG. 5, for making current measurements.

The secondary windings 40 and 42 of the first current transformer 26 and the secondary winding 54 of the current transformer 46 are respectively connected to either a single-pole double throw switch 58 which breaks the non-grounded conductor or a double pole, double throw switch 58 for breaking two non-grounded conductors. Switch 58 provides selective switching between connection to the secondary of the first current transformer 26 or the second current transformer 46 to produce on output 60 current proportional to either the differential or common-mode current. The output 60 from the switch 58 may be coupled to a frequency compensation circuit to provide compensation for non-linearity in the response to currents of relatively high frequency (e.g. megahertz range). Frequency compensation is not part of the present invention and is well known.

FIG. 4 illustrates an end view of the low reluctance magnetic circuits 28 and 48 without a housing. The low reluctance magnetic circuit 48 in the form of a twisted loop in a FIG. 8 has a pitch or twist measured parallel to a longitudinal axis of the first and second conductive groups 22 and 24 sufficient that none of the parts 30, 32, 34 and 36 intersect at crossover(s) 29 between adjacent levels of the low reluctance magnetic circuit to prevent a short circuit in the loop of the low reluctance magnetic circuit 28 and only at the aligned circular cross section of the low reluctance magnetic circuit 28 when the housing 70 is closed. The low reluctance magnetic circuit 48 is in the form of a single loop having parts 50 and 52 disposed in a flat profile.

FIG. 5 illustrates in detail one form of a housing 70 containing the embodiment of FIG. 3 which may be used with the present invention. The housing 70 has a first part 72 and a second part 74 which are pivoted between opened and closed positions by a hinge 76 or other conventional pivoting mechanisms. The housing 70 itself should be made from a material having at least an electrically conductive outer surface to shield pickup from electrostatically induced electrical noise. The upper part of the housing 72 and the lower part 74 of the housing each have first and second channels 78 which, as illustrated, are semicylindrical and which are fabricated, located or extend into the surface 80 of the first and second parts. The channels 78 of the lower part 74 receive the first and second conductive groups 22 and 24 when the housing 70 is in the open position when the upper part 72 is pivoted at least above the lower part by means of the hinge 76. The channels 78 are opposed to each other and respectively surround and contain the first and second conductive groups 22 and 24 when the housing 70 is in the closed position as illustrated in FIG. 5 to provide passages 79 through the housing. It is important to note that an electrical discontinuity 82 which, as shown, is an annular ring extending through the conductive housing 70 to an underlying insulator, should be provided by leaving an air gap or providing an insulated break in the electrostatic shield in order to prevent the formation of a short circuit turn which shorts the secondary of the first and second current transformers 26 and 46 in accordance with FIG. 3 which are contained in the housing 70. The prevention of short circuiting of the secondaries 40, 42 and 54 with an electrical discontinuity is well known and is not part of the present invention. As illustrated, the switch 58 is positioned for producing an output of common-mode current on the output conductors 60 by positioning the switch element 84 in a position aligned with the label "CM" which stands for "common-mode". Alternatively, the switch element 84 is positioned for producing an output of differential-mode current in a position aligned with the label "DM" which stands for "differential-mode". Selecting of the position of the switch element 84 provides for the selective outputting of a current proportional to either twice the common-mode or differential-mode current flow in the first and second conductive groups 22 and 24.

The pivoted housing 70 having two parts 72 and 74 defines in the closed position passages 79 formed by the channels 78 which surround and contain the first and second conductive groups 22 and 24. This position is used by the current measuring device 20 to sense either common-mode or differential-mode currents or alternatively both the common-mode and differential-mode currents on separate pairs of outputs as described below without alteration of the electrical circuits containing the first and second conductive groups. In the prior art as described above, alteration of the electrical circuit having differential-mode currents to be measured was required.

The mounting of the embodiment of FIGS. 3 and 4 in the housing 70 of FIG. 5 may be accomplished in numerous ways. The parts of the low reluctance magnetic circuits 28 and 48 and associated secondary windings 40, 42 and 54 may be contained and mounted in the upper and lower parts 72 and 74 by casting, molding or other mounting mechanisms. Furthermore, electrical shielding of the housing 70 by making at least the outside surface electrically conductive may be accomplished by numerous well known coating techniques and shields the secondary windings 40, 42 and 54 from having electrical noise induced therein from noise sources external to the current flow in the first and second conductive groups 22 and 24.

FIG. 6 illustrates a view of the housing 70 containing the low reluctance magnetic circuits 28 and 48 in a fully open positioned in which a space exists for inserting the first and second conductive groups 22 and 24 into the lower semicylindrical channels 78 illustrated in FIG. 5 to be received in the first and second openings 37 and 39. When the parts 72 and 74 are pivoted, as illustrated in FIG. 6 180° to the position of FIG. 5, the parts 30, 32, 34 and 36 are in a fully aligned position to complete the low reluctance magnetic circuit 28 and close the first and second openings 37 and 39 to a position at which, at crossover 29, there is no contact creating a short circuit of the low reluctance magnetic circuit 28.

With the present invention, measurement of either differential or common-mode currents requires a series of simple steps as follows: Opening the housing 70 by pivoting the upper part 72 upward to open the channels 78; positioning the first and second conductive groups 22 and 24 in alignment with the channels 78 in the lower part 74 of the housing 70; pivoting the upper part 72 of the housing 70 downward to oppose the channels 78 to define the passages 79 around and containing the first and second conductive groups which completes the low reluctance magnetic circuits 26 and 48 and positions the low reluctance circuits to close the first and second openings 37 and 39 around the first and second conductive groups 22 and 24; positioning the switch element 84 in alignment with the label "CM" or "DM" indicating the type of current to be measured and connecting electrical leads to the outputs 60. The prior art does not provide a device which operates in the above manner which permits either single wires or groups of wires which make up the first and second conductive groups 22 and 24 without alteration to be easily positioned for sensing either common-mode or differential-mode currents by simply pivoting the measuring device into an open position and thereafter closing the housing 70 around the first and second conductive groups as illustrated in FIG. 5 to confine then in the channels 78 and close the first and second openings 37 and 39.

Alternatively, the secondaries of the first and second current transformers 26 and 48 may be provided each with a dedicated pair of outputs making simultaneous measuring of common and differential-mode currents possible. In this configuration, the switch 58 is eliminated and a second pair of outputs is provided below the label "DM". The output 60 would be dedicated to outputting common-mode current and the second pair of outputs (not illustrated in FIG. 5) would be dedicated to reading differential-mode current.

While the invention has been described in terms of a preferred embodiment, it should be understood that numerous modifications may be made thereto without departing from the spirit and scope of the invention. It is intended that all such modifications fall within the scope of the dependent claims.

I claim:

1. A device for measuring at least time varying differential-mode current flowing in first and second conductive groups comprising:

a current transformer having a low reluctance magnetic circuit in a loop including a first portion defining a first opening positionable to surround the first conductive group and a second portion defining a second opening positionable to surround the second conductive group for canceling common-mode flux produced by common-mode current flowing in the first and second conductive groups, the first conductive group being a first primary when surrounded with the first opening and the second conductive group being a second primary when surrounded with the second opening, a secondary having at least one turn surrounding the first portion of the low reluctance magnetic circuit and at lest one turn surrounding the second portion of the low reluctance magnetic circuit for outputting a current representing the differential-mode current flowing in the first and second conductive groups; and wherein the low reluctance magnetic circuit has a plurality of parts with the parts being moveable to open the first and second openings to enable the first and second conductive groups to be inserted into the first and second openings, respectively, and to close the first and second openings to form the low reluctance magnetic circuit and to surround the first and second conductive groups to permit measurement of at least the differential-mode current without alteration of the first and second conductive groups and wherein a first part has first and second half-loops of magnetic material and a second part has third and fourth half-loops of magnetic material and wherein the first through fourth half-loops form a twisted loop when the low reluctance magnetic circuit is formed.

2. A device in accordance with claim 1 wherein:

the at least one turn surrounding the first portion defining the first opening and the at least one turn surrounding the second portion defining the second opening are wrapped in phase around the low reluctance magnetic circuit.

3. A device in accordance with claim 1 wherein:

a common-mode current flowing in the first and second conductive groups respectively produces magnetic fluxes in the low reluctance magnetic circuit which are in phase opposition to each other.

4. A device in accordance with claim 2 wherein:

a common-mode current flowing in the first and second conductive groups respectively produces magnetic fluxes in the low reluctance magnetic circuit which are in phase opposition to each other.

5. A device in accordance with claim 1 wherein:

the low reluctance magnetic circuit is a FIG. 8 with the first opening being a first opening of the FIG. 8 and the second opening being a second opening of the FIG. 8.

6. A device in accordance with claim 2 wherein:

the low reluctance magnetic circuit is a FIG. 8 with the first opening being a first opening of the FIG. 8 and the second opening being a second opening of the FIG. 8.

7. A measuring device in accordance with claim 3 wherein:

the low reluctance magnetic circuit is a FIG. 8 with the first opening being a first opening of the FIG. 8 and the second opening being a second opening of the FIG. 8.

8. A measuring device in accordance with claim 4 wherein:

the low reluctance magnetic circuit is a FIG. 8 with the first opening being a first opening of the FIG. 8 and the second opening being a second opening of the FIG. 8.

9. A measuring device in accordance with claim 1 further comprising:
- a second current transformer having a low reluctance magnetic circuit positionable to surround the first and second conductive groups with the first and second conductive groups being a primary of the second current transformer and a secondary including at least one turn which surrounds the low reluctance magnetic circuit of the second current transformer for outputting a current representing common-mode currents flowing in the first and second conductive groups.

10. A measuring device in accordance with claim 1 further comprising:
- a housing having first and second parts which are connected by a pivot to position the housing in open and closed positions, a first part of the housing and a second part of the housing each having first and second channels extending into a surface respectively of the first and second parts of the housing which receive the first and second conductive groups when the housing is in the open position and which are opposed to each other and respectively surround the first and second conductive groups when the housing is in the closed position to form passages extending through the housing and close the first and second openings.

11. A measuring device in accordance with claim 9 further comprising:
- a housing having first and second parts which are connected by a pivot to position the housing in open and closed positions, a first part of the housing and a second part of the housing each having first and second channels extending into a surface respectively of the first and second parts of the housing which receive the first and second conductive groups when the housing is in the open position and which are opposed to each other and respectively surround the first and second conductive groups when the housing is in the closed position to form passages extending through the housing and close the first and second openings.

12. A measuring device in accordance with claim 11 further comprising:
- a switch have a pair of output terminals for selectively outputting current from either the secondary of the first or second current transformer.

13. A measuring device in accordance with claim 1 wherein:
- the first and second conductive groups each comprise a single wire.

14. A measuring device in accordance with claim 1 wherein:
- the first and second conductive groups each comprise a plurality of wires.

15. A measuring device in accordance with claim 1 wherein:
- the low reluctance magnetic circuit comprises four parts.

16. A measuring device in accordance with claim 5 wherein:
- the low reluctance magnetic circuit comprises four parts.

17. A measuring device in accordance with claim 6 wherein:
- the low reluctance magnetic circuit comprises four parts.

18. A measuring device in accordance with claim 7 wherein:
- the low reluctance magnetic circuit comprises four parts.

19. A measuring device in accordance with claim 8 wherein:
- the low reluctance magnetic circuit comprises four parts.

20. A measuring device in accordance with claim 11 wherein:
- the low reluctance magnetic circuit of the first current transformer comprises four parts with two of the four parts being disposed in the first part of the housing and a remaining two of the four parts being disposed in the second part of the housing; and
- the low reluctance magnetic circuit of the second current transformer comprises two parts with one of the two parts being disposed in the first part of the housing and a remaining one of the two parts being disposed in the second part of the housing.

* * * * *